United States Patent [19]

Krause

[11] Patent Number: 4,897,557
[45] Date of Patent: Jan. 30, 1990

[54] ELECTRONIC CONTROL SYSTEM, IN PARTICULAR FOR A PRINTER

[75] Inventor: Jürgen Krause, Niedereschach, Fed. Rep. of Germany

[73] Assignee: Mannesmann Aktiengesellschaft, Düsseldorf, Fed. Rep. of Germany

[21] Appl. No.: 163,764

[22] PCT Filed: Jun. 12, 1987

[86] PCT No.: PCT/DE87/00274
§ 371 Date: Mar. 7, 1988
§ 102(e) Date: Mar. 7, 1988

[87] PCT Pub. No.: WO87/07987
PCT Pub. Date: Dec. 30, 1987

[30] Foreign Application Priority Data

Jun. 19, 1986 [DE] Fed. Rep. of Germany ....... 3620535

[51] Int. Cl.[4] .................. H02H 3/87; H03K 17/08
[52] U.S. Cl. .................. 307/134; 307/135;
361/152; 361/154; 361/191; 400/120; 219/216;
346/76 PH; 101/93.03; 101/93.29
[58] Field of Search .................. 307/105-110,
307/134, 135, 150; 361/152-155, 160, 191, 192;
400/120, 121, 124, 126, 154.4, 154.5, 155, 225,
320, 322; 346/76 PH, 76 R, 76 L, 75, 140 R, 140
PD, 140 IJ; 101/93.03, 93.04, 93.05, 93.09,
93.10, 93.14, 93.18, 93.21, 93.23, 93.29, 35, 37;
219/216, 543, 483, 216 PH

[56] References Cited

U.S. PATENT DOCUMENTS

| | | | |
|---|---|---|---|
| 3,589,282 | 6/1971 | King | 101/93.29 X |
| 3,909,681 | 9/1975 | Campari et al. | 101/93.03 X |
| 4,019,100 | 4/1977 | Barrus | 101/93.29 X |
| 4,293,888 | 10/1981 | McCarty | 361/152 |
| 4,330,786 | 5/1982 | Hatabe et al. | 346/76 PH |
| 4,368,666 | 1/1983 | Kozawa et al. | 101/93.03 X |
| 4,399,483 | 8/1983 | Phelan | 361/154 |
| 4,409,600 | 10/1983 | Minowa | 346/76 PH |
| 4,453,194 | 6/1984 | Frankeny et al. | 361/152 X |
| 4,594,501 | 6/1986 | Culley et al. | 219/216 PH X |
| 4,642,657 | 2/1987 | Asakura | 400/120 X |
| 4,667,117 | 5/1987 | Nebgen et al. | 361/152 X |
| 4,714,363 | 12/1987 | Minowa | 400/120 X |

Primary Examiner—William M. Shoop, Jr.
Assistant Examiner—Paul Ip
Attorney, Agent, or Firm—Horst M. Kasper

[57] ABSTRACT

Such electronic control systems contain safety circuits for device components endangered by excessive currents or excessive voltages, which are constructed only for a pulse operation and not for higher relative switch-on times.

In order to shield the effectors (users) already in the pre-stage against undesirable high currents or, respectively, voltages, such that a punch through of these destroying voltages or, respectively, currents can be excluded for practical purposes, it is disclosed that an effector (1) is controllable in operating condition and simultaneously a reference voltage (R1/R2) can be switched on within the permissible tolerance region where, upon the exceeding of the tolerance region, the effector (1) can be switched off.

18 Claims, 1 Drawing Sheet

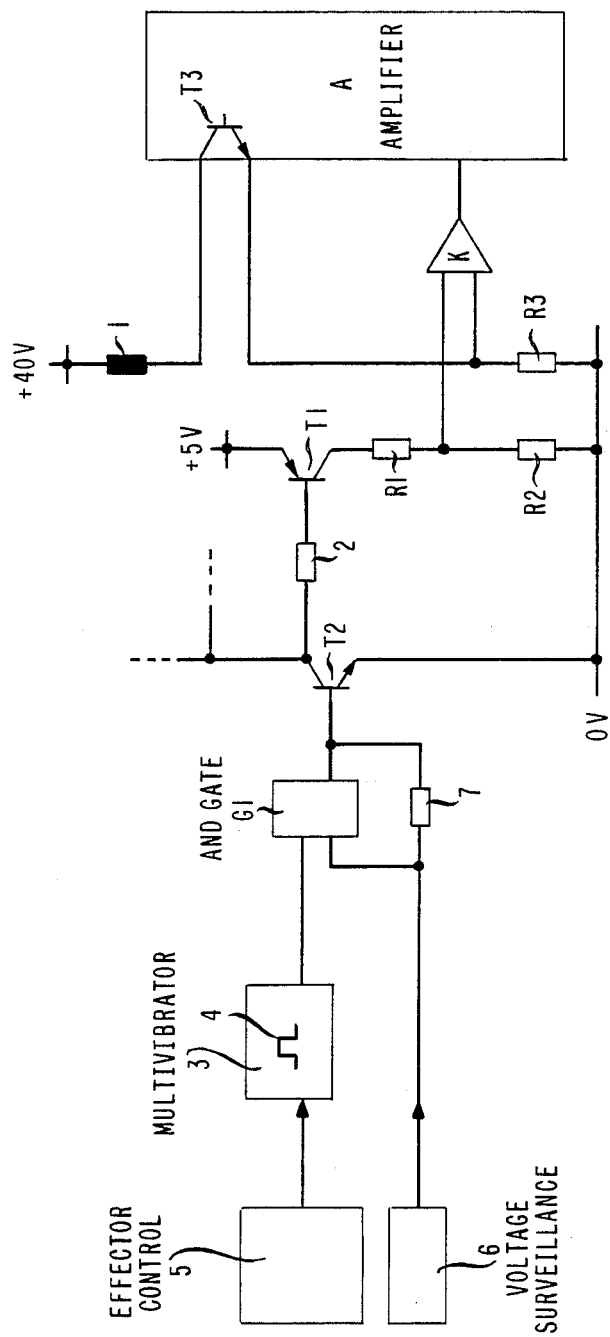

ELECTRONIC CONTROL SYSTEM, IN PARTICULAR FOR A PRINTER

The invention relates to an electronic control circuit, in particular for a printer, which includes a safety circuit for device components endangered by excessive currents and excessive voltages, where the power elements are connected in series to the effectors and where the power elements and the effectors are dimensioned for a pulse operation and where the users are switched off or switched on in case of an overflow or underflow of the prescribed current or, respectively, of the prescribed voltage.

In equipment electronics, in particular in the electronic for printers, there are used in addition to logic elements, a sequence of power elements which, in general, are operated with a voltage of from 30 volts to 50 volts. Such power elements actuate power switches the so-called effectors (actuating units, users) such as, for example, electromagnetic coils in the printer device groups and pin print heads, DC current motors and step motors.

Both the power elements as well as the effectors are usually constructed for pulse operation and not for a higher relative switch-on time. However, a 100-percent relative switch-on time is in no case presupposed.

Irregular operating conditions within an equipment control cannot be excluded in many operating phases, in particular within the phases of a printer control. In case of a switching on or switching off of the operating voltage and in the testing phase (for example upon an interruption of the program with an emulator), the effectors are endangered and can be damaged or can be even destroyed.

According to the state of the art, safety circuits are known where switches, provided as power transistors, are disposed in the voltage feed of the power elements. These power transistors are relatively large and expensive and have to be cooled, with the exception of special cases, since they result in a high power loss. In addition, in the case of such power transistors, the effector voltage is reduced by the amount of the collector-emitter voltage such that the power of the user is lowered by the amount of the power loss of the power transistor.

It is an object of the present invention to disclose this safety circuit within an electronic control circuit, in particular for printers, which avoids the recited disadvantages and which allows to protect an effector already in the pre-stages against undesirable high current or, respectively, voltages, such that a punch-through of these destroying voltages or, respectively, currents can be practically excluded.

The object of the above designated electronic control circuit is achieved according to the invention by having an effector controllable in operating condition and by simultaneously switching on a reference voltage in a permissible tolerance region where, upon the exceeding of the reference voltage, the effector can be switched off. In principle, the effector is therefore only actuated if the function of the effector is required for the operation of the apparatus, for example of the printer. In such a case, the effector is however only then fed with current when the operating voltage has a level within a predetermined permissible tolerance region. The feeding of current is therefore initially associated with the activation and with the voltage tolerance region.

According to a further feature of the invention, it is disclosed that an amplifier is connected in series to the effector and that a comparator for a comparison of the reference voltage with a voltage generated by the effector current is connected in series and that the reference voltage can be generated by dependence on two series-connected transistors, of which the pre-switched transistor can be switched through only with an operating voltage within a permissible tolerance region and where the transistor connected at the outlet side can only be switched through in case of a switched-through pre-switched transistor in order to generate the reference voltage. In contrast to the state of the art, only transistors of the most economic construction are employed here, i.e. transistors produced according to the so-called surface-mounted device, or SMD, technique.

Another improvement provided by the invention includes that the pre-switched transistor is switched through only then when a pre-switched, re-triggerable monostable multivibrator is triggered within a preset time by the connected effector control. Consequently, the set time of the control of the respective effector is an additional precondition for the switching-through of the transistors.

A further safety stage is achieved by connecting the re-triggerable monostable multivibrator via an UND gate at the series-connected transistor and that the UND gate is connected to a separate voltage surveillance. Consequently, a voltage acceptance message and the control of the respective device component are additional preconditions for the control of the series-connected transistor.

A further improvement according to the invention includes that the comparator and the resistors generating the reference voltage form an integrating device component.

The range of application of the invention can include, according to additional features, that a transistor, switchable within a permissible tolerance region by the operating voltage, is coordinated in each case to an effector or to a group of effectors as well as the transistor connected at the outlet side to the said transistor.

An embodiment of the invention is illustrated in the drawing and is described in the following in more detail.

DESCRIPTION OF THE DRAWING

The single FIGURE of the drawing illustrates an invention control circuit in a simplified representation.

DETAILED DESCRIPTION OF THE PREFERRED EMBODIMENT

The effector (1) can be a device component of an arbitrary electronic control circuit and is comprised within a printer control of an inductivity with a very low ohmic resistance. Therefore, the effector (1) can also comprise the winding of a DC motor, of a step motor, or of an electromagnetic coil of a pin print head for a matrix pin printer. A comparator (K) compares the voltage generated at the resistor (R3) by the user current with the reference voltage set by the reference voltage resistors (R1 and R2). Upon an exceeding of the reference voltage, the comparator (K) switches off the effector (1), i.e. the user, via an amplifier (A). The preceding described switching part means a first safety step in order to protect the effector (1) from damages or from a complete destruction. Under regular operating conditions, the comparator (K) therefore switches on the effector (1) via the amplifier (A), i.e. the transistor (T3) of the amplifier (A).

The reference voltage (R1/R2) is only being generated if a transistor (T1), of the type PNP, series-connected to the resistor (R1), is switched through. In case the transistor (T1) is blocking, the reference voltage (R1/R2) is equal to zero such that the effector (1) remains continuously switched off by the comparator (K). The transistor (T1) is only opened when a transistor (T2), of the type NPN, series-connected to the transistor (T1), is switched through, the collector of the transistor (T2) is connected via a protective resistor (2) with the base of the transistor (T1). The preceding described switching part therefore involves a second safety step in order to protect the effector (1) from damage.

The transistor (T2) is only opened if the operating voltage is disposed in the permissible tolerance region and a re-triggerable monostable multivibrator (3) is triggered, which multivibrator receives a corresponding signal (4) from the effector control (5). The effector control (5) comprises the printer controls in case of a printer. In case the multivibrator (3) is not triggered again within the set time period, then the transistor (T2) is blocked via an AND gate (G1), which is switched between the multivibrator (3) and the transistor (T2). Since the transistor (T2) is blocked, the transistor (T1) is not actuated so that no reference voltage (R1/R2) can be generated. The precedingly described switching part therefore illustrates a third safety stage in order to protect the effector (1) from damages.

Furthermore, a voltage surveillance (6) is provided, which comprises an integrated building component with transistor circuit, which tests the input voltage, which is in this case for example 5 volts. The voltage surveillance provides a voltage acceptance message or a voltage deficiency message via the AND gate (G1). A resistor (7) is switched between the base of the transistor (T2) and the gate (G1), since the gate (G1) is a building component with an open collector. The voltage surveillance (6) now provides a fourth safety stage in order to protect the effector (1) from damage. In this case it is disclosed that the present safety device is intended not only for the operation of the corresponding device, i.e. for the control of a printer, but also for the test phases, within which special switching states can occur.

I claim:

1. An electronic control system comprising
an effector;
a power element connected in series to the effector and where the power element and the effector are dimensioned and connected for performing a pulse operation; a safety circuit for electronic device components endangered against excessive currents or excessive voltage including
a first resistor;
a second resistor connected in series to the first resistor;
a voltage source connected to the first resistor and to the second resistor furnishing a reference voltage which can be controlled during operation;
a comparator having a first input fed with the reference voltage and having a second input fed with a voltage related to a power passing through the effector;
switching means for switching the effector on where the power passing through the effector is within a permissible tolerance region and for switching the effector off where the power passing through the effector exceeds a limiting reference level of the reference voltage.

2. The electronic control system according to claim 1 wherein the effector is a printer circuit.

3. The electronic control system according to claim 1 further comprising
an amplifier connected in series with and feeding a signal to the effector;
the comparator connected in series with and feeding a signal to the amplifier for amplifying a voltage depending on a comparison of the reference voltage with a voltage generated by an effector current;
a first transistor;
a pre-switched transistor connected in series to the first transistor, where the reference voltage is generated depending on the first transistor and on the pre-switched transistor, where the pre-switched transistor can only be switched through with an operating voltage within the permissible tolerance region and where the first transistor connected at an outlet side of the first transistor can only be switched through in case the pre-switched transistor is switched through in order to generate the reference voltage.

4. The electronic control system according to claim 3 further comprising
a mono-stable re-triggerable multivibrator wherein the pre-switched transistor can only be switched through if the monostable re-triggerable multivibrator is triggered within a preset time by a control signal from the connected effector.

5. The electronic control system according to claim 4 further comprising
a separate voltage surveillance;
an AND-gate where the monostable re-triggerable multivibrator is connected via the AND-gate to the pre-switched switched transistor and wherein the AND-gate is connected to the separate voltage surveillance.

6. The electronic control system according to claim 1 wherein the comparator, the first resistor and the second resistor form a voltage divider for supplying a reference voltage input of the comparator.

7. The electronic control system according to claim 1 further comprising
a first transistor;
a pre-switchable transistor switchable by an operating voltage within a permissible tolerance region, and wherein the first transistor is connected at the outlet side and wherein the first transistor and the pre-switched transistor are coordinated to the effector.

8. An electronic control system comprising an effector having a first terminal connected to a voltage source and having a second terminal;
a power control element having a power terminal connected to the second terminal of the effector and where the power element and the effector are connected and matched for a pulse operation and said power control element having a second power terminals and a control terminal;
a first resistor having a first and a second terminals;
a second resistor having a first and a second terminals connected with its first terminal to the second terminal of the first resistor at a connection point for supplying at this connection point a reference voltage;

a comparator having a first input terminal connected to the second terminal of the first resistor and having a second input terminal fed with a voltage related to a power passing through the effector and having an output terminal connected to the control terminal of the power control element;

switching means connected to the first terminal of the first resistor for switching the effector on where the power passing through the effector is within a permissible tolerance region and for switching the effector off where the power passing through the effector exceeds a limiting reference level of the reference voltage.

9. The electronic control system according to claim 8 wherein the power control element includes an amplifier for amplifying a voltage depending on an output of the comparator depending on a level of the reference voltage and on a level of a voltage generated by an effector current and further comprising a voltage source having a terminal;

a first transistor having a first power terminal connected to the terminal of the voltage source and having a second power terminal connected to the first terminal of the first resistor;

a current limiting resistor having a first terminal and a second terminal connected to the control input of the first transistor;

a second transistor having a first power terminal connected to the first terminal of the current limiting resistor and having a second power terminal connected to the second power terminal of the second resistor and having a control input, where the reference voltage is generated depending on the first transistor and on the second transistor and where the second transistor can only be switched through with a control voltage applied to the control terminal within a permissible tolerance region and where the first transistor can only be switched through in case the second transistor is switched through for generating the reference voltage.

10. The electronic control system according to claim 9 further comprising a mono-stable re-triggerable multivibrator having an output terminal connected to the control input of the second transistor wherein the second transistor can only be switched through if the pre-switched re-triggerable monostable multivibrator is triggered within a preset time by a control signal from the connected effector.

11. The electronic control system according to claim 10 further comprising a separate voltage surveillance having an output terminal; an AND-gate having a first input terminal connected to the output of the mono-stable multivibrator and having a second input terminal connected to the output terminal of the separate voltage surveillance and having an output terminal connected to the control input of the second transistor.

12. The electronic control system according to claim 11 further comprising a fourth resistor having a first terminal connected to the output of the separate voltage surveillance and having a second terminal connected to the control terminal of the second transistor.

13. The electronic control system according to claim 8 wherein the comparator, the first resistor and the second resistor form a voltage divider for supplying a reference voltage input of the comparator.

14. The electronic control system according to claim 8 further comprising a third resistor having a first terminal connected to the second input of the comparator and to the power input of the power control element and having a second terminal connected to the second terminal of the second resistor.

15. A method for electronically controlling an effector comprising the steps of connecting the effector with a first terminal to a voltage source and where the effector has a second terminal; connecting a power terminal of a power control element to the second terminal of the effector, where the power element and the effector are connected and matched for a pulse operation and where said power control element has a second power terminal and a control terminal;

furnishing a reference voltage input of a comparator at a connection point between a first resistor having a first and a second terminals and a second resistor having a first and a second terminals connected with its first terminal to the second terminal of the first resistor a reference voltage;

feeding the reference voltage to a second input terminal of the comparator with a voltage related to a power passing through the effector said comparator having a first input terminal connected to the second terminal of the first resistor and having an output terminal connected to the control terminal of the power control element;

switching the effector on where the power passing through the effector is within a permissible tolerance region and switching the effector off where the power passing through the effector exceeds a limiting reference level of the reference voltage with switching means connected to the first terminal of the first resistor.

16. The method for electronically controlling an effector according to claim 15 further comprising amplifying a voltage depending on an output of the comparator depending on a level of the reference voltage and on a level of a voltage generated by an effector current with an amplifier comprised in the power control element; switching a second transistor only through with a control voltage within a permissible tolerance region applied to a control terminal of the second transistor;

switching a first transistor only through in case the second transistor is switched through where the first transistor has a first power terminal connected to the terminal of a voltage source and has a second power terminal connected to the first terminal of the first resistor, where a current limiting resistor has a first terminal and a second terminal connected to the control input of the first transistor, and where the second transistor has a first power terminal connected to the first terminal of the current limiting resistor and has a second power terminal connected to the second power terminal of the second resistor and where the second transistor has a control input; generating the reference voltage depending on a conduction state first transistor and on the second transistor.

17. The method for electronically controlling an effector according to claim 16 further comprising
triggering a re-triggerable monostable multivibrator within a preset time by a control signal from the effector for exclusively switching through the second transistor, where the mono-stable re-triggerable multivibrator has an output terminal connected to the control input of the second transistor.

18. The method for electronically controlling an effector according to claim 17 further comprising
surveilling the effector with a separate voltage surveillance having an output terminal;
controlling an input of the second transistor connected to an output terminal of an AND-gate having a first input terminal connected to the output of the mono-stable multivibrator and having a second input terminal connected to the output terminal of the separate voltage surveillance.

* * * * *